United States Patent [19]
Unger et al.

[11] Patent Number: 6,098,131
[45] Date of Patent: Aug. 1, 2000

[54] NETWORK APPARATUS WITH REMOVABLE ELECTRONIC MODULE

[75] Inventors: Dave Unger, Windham, N.H.; David J. Berman, Swampscott, Mass.; Christopher Grobicki, Andover, Mass.; Lance J. McNally, Townsend, Mass.; Mark Shufelt, Salem, N.H.; John Ulm, Pepperell, Mass.

[73] Assignee: Nortel Networks Limited, Montreal, Canada

[21] Appl. No.: 09/072,410

[22] Filed: May 4, 1998

[51] Int. Cl.[7] .................................................. G06F 13/14
[52] U.S. Cl. ........................ 710/101; 710/102; 710/103; 361/683; 361/686; 361/687
[58] Field of Search ................................. 710/101, 102, 710/103; 361/683, 686, 687

[56] References Cited

U.S. PATENT DOCUMENTS

| | | | |
|---|---|---|---|
| 5,471,474 | 11/1995 | Grobicki et al. | 370/85.2 |
| 5,477,415 | 12/1995 | Mitcham et al. | 361/686 |
| 5,619,398 | 4/1997 | Harrison et al. | 361/686 |
| 5,684,673 | 11/1997 | Shibasaki et al. | 361/686 |
| 5,784,253 | 7/1998 | Ooka et al. | 361/686 |
| 5,816,673 | 10/1998 | Sauer et al. | 312/223.2 |
| 5,875,094 | 2/1999 | Kirkendoll | 361/686 |
| 5,926,627 | 7/1999 | Sugimura | 395/281 |
| 5,933,321 | 8/1999 | Ruch et al. | 361/686 |
| 5,941,965 | 8/1999 | Moroz et al. | 710/101 |

OTHER PUBLICATIONS

"Data–Over–Cable Service Interface Specifications", Radio Frequency Interface Specification, 1997, Cable Television Laboratories, Inc.

*Primary Examiner*—Thomas C. Lee
*Assistant Examiner*—Abdelmoniem Elamin
*Attorney, Agent, or Firm*—Blakely Sokoloff Taylor & Zafman LLP

[57] ABSTRACT

A network apparatus having a chassis with an external network data port and a removable electronic module coupled to the network data port through an internal data port when the removable electronic module is present in the chassis. The chassis may also provide power, radio frequency (RF), data bus, and other types of electrical and data connections to the electronic module through the use of additional internal ports. The apparatus may additionally be connected to others via a data bus, and be included as part of a rack-mounted system. The electronic module may be inserted and removed from the chassis while electrical power is applied to the chassis.

10 Claims, 9 Drawing Sheets

NETWORK APPARATUS WITH REMOVABLE ELECTRONIC MODULE

FIELD OF THE INVENTION

This invention relates generally to data communications networks, and more particularly, to a network apparatus having a chassis with multiple external network ports and a removable electronic module coupled to the network ports through an internal port when the removable electronic module is present in the chassis.

BACKGROUND OF THE INVENTION

Community-antenna television (CATV), often referred to simply as cable TV, uses coaxial cable to distribute standard television signals to customers receiving the service. Generally, CATV systems are accessed by greater numbers of users than access either local area network (LAN) or metropolitan area network (MAN) systems. CATV systems typically include a head end at which signals that are received from the source of programming material are processed for transmission over the system, a trunk system, which is the main artery carrying the processed signals, a distribution system, which is a bridge from the trunk system lines and carries signals to subscriber areas, and subscriber drops, which are fed from taps on the distribution system to feed subscriber TV receivers.

In order to service the large number of subscribers positioned randomly over the very large geographic area covered by a CATV system, the head end has both wireless and wired connections to distribution systems or remote head ends, which connect to yet further distribution systems. These distribution schemes include the use of satellites.

The primary goal of CATV has been to provide high quality TV signals for subscribers. However, today some CATV systems use optical fiber cable to increase the number of channels that can be carried. These systems also have some interactive communications between the subscribers and the programming source, and between subscribers. As a result, CATV systems can carry many more TV channels than ever before, as well as provide other types of communications services on a limited basis.

CATV systems have a spanning tree topology. In principle, this could be adapted to expand the interactive communications capability that now exists in CATV systems. One such interactive communications capability is that provided by a packet-switched network connection to subscribers via a modem at the subscriber's location, also known as a cable modem. In response to packet-switched information being carried on CATV systems, the CATV network topology typically requires an increased number of spanning tree networks to provide greater data bandwidth to subscribers by reducing the total number of subscribers on any one network. Typical systems may only be able to accommodate between 200–300 subscribers per spanning tree network. Therefore, a total service area which includes, for example, 10,000 subscribers, may require up to 50 network ports at the head end.

The increased number of network connections at the head end aggravates at least two problems. First, head end coaxial cables are typically held in place with threaded connectors, and it is difficult to connect and disconnect the cables with a wrench if they are in close physical proximity to each other. The greater the number and density of the connections, the greater the difficulty is in connecting and disconnecting them.

Second, to allow for expandability of the network and ease of repair, the head end typically has multiple electronic modules to which the network connections are attached. The electronic modules are usually stacked vertically on top of one another in a rack. If an electronic component in a module fails, the module may be removed from the system without affecting the connections of the other modules. However, because the network connections are attached directly to a module, they must all be disconnected from the faulty module and reconnected to a new module before service to subscribers can resume. The necessity of disconnecting and reconnecting the network connections greatly increases the mean time to repair (MTTR).

Therefore, there is a need for a way to easily connect network connections to a head end which allows for system expandability and quick repair.

SUMMARY OF THE INVENTION

The present invention provides a network apparatus having a chassis with an external network data port and a removable electronic module coupled to the network data port through an internal data port when the removable electronic module is present in the chassis. The chassis may also provide power, radio frequency (RF), data bus, and other types of electrical and data connections to the electronic module through the use of additional internal ports. The apparatus may additionally be connected to others via a data bus, and be included as part of a rack-mounted system. The electronic module may be inserted and removed from the chassis while electrical power is applied to the chassis.

BRIEF DESCRIPTION OF THE DRAWINGS

The present invention is illustrated by way of example and may be better understood by referring to the following description in conjunction with the accompanying drawings, in which like references indicate similar elements and in which.

DETAILED DESCRIPTION OF A PREFERRED EMBODIMENT OF THE PRESENT INVENTION

In the following description of a preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

The present invention provides for a network apparatus having a chassis with external network data ports and a removable electronic module coupled to the network data ports through one or more internal data ports when the removable electronic module is present in the chassis. The configuration allows the electronic module to be inserted and removed from the chassis without connecting and disconnecting the external network data ports. The electronic module is optionally hot-swappable and may be inserted and removed from the chassis while electrical power is applied to the chassis. In addition to data connections, the present invention also provides for power, radio frequency (RF), data bus, and other types of electrical and data connections to the electronic module. The present invention is versatile and is applicable to a wide range of network devices and applications. The present invention is compatible with rack-mounted systems which enable incremental scaling of the network. The ability to insert and remove the electronic module without connecting and disconnecting the external network data ports greatly reduces the mean time to repair (MTTR) for the system.

For the purpose of illustration, one embodiment of present invention is described below in the context of data-over-cable service, also known as cable modem service. Information and specifications relating to data-over-cable service are described in the document "Data-Over-Cable Service Interface Specifications: Radio Frequency Specification", SP-RFI-I02-9710008, Oct. 8, 1997, Cable Television Laboratories, Louisville, Colorado, which is incorporated herein by reference. A communications highway network system for the interactive communication of digital and analog information that incorporates LAN, MAN and CATV technology is described by Grobicki et al., "COMMUNICATIONS HIGHWAY NETWORK SYSTEM", U.S. Pat. No. 5,471,474, issued Nov. 28, 1995, which is incorporated herein by reference. It will be recognized by one of ordinary skill in the art that the present invention may be used with other applications and network devices without loss of generality, such as local area networks (LANs), wide area networks (WANs), metropolitan area networks (MANs), plain old telephone service (POTS) modems, packet switched networks including, but not limited to, transmission control protocol/internet protocol (TCP/IP) networks, twisted pair and coaxial cables, optical fiber, and other types of networks and physical connections.

Figure 1:
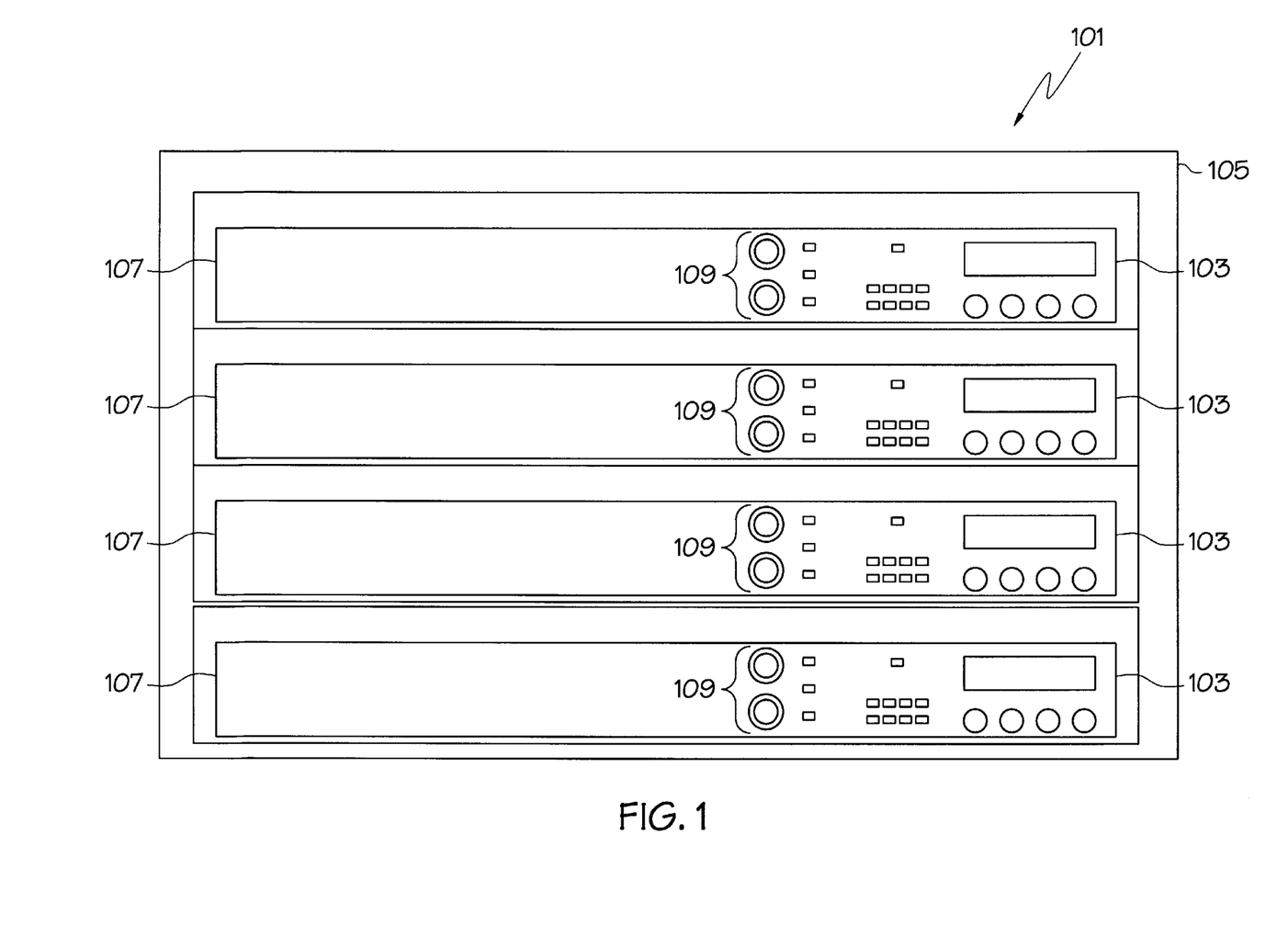
FIG. 1 shows a front view of preferred stacked network apparatus modules compatible with the present invention.

FIG. 1 shows a front view of a preferred stacked network apparatus 101. A removable module 103 may preferably be stacked in a vertical configuration via a rack 105. The front panel 107 of removable module 103 preferably contains an electronic display 109 which gives status and diagnostic information about the removable module 103, through any number of means, including but not limited to light emitting diodes (LEDs), liquid crystal display (LCD) panels, or other electronic display mechanisms. Optional user-operated controls for each removable module 103, such as power or reset controls, may also be located on front panels 107.

Figure 2:
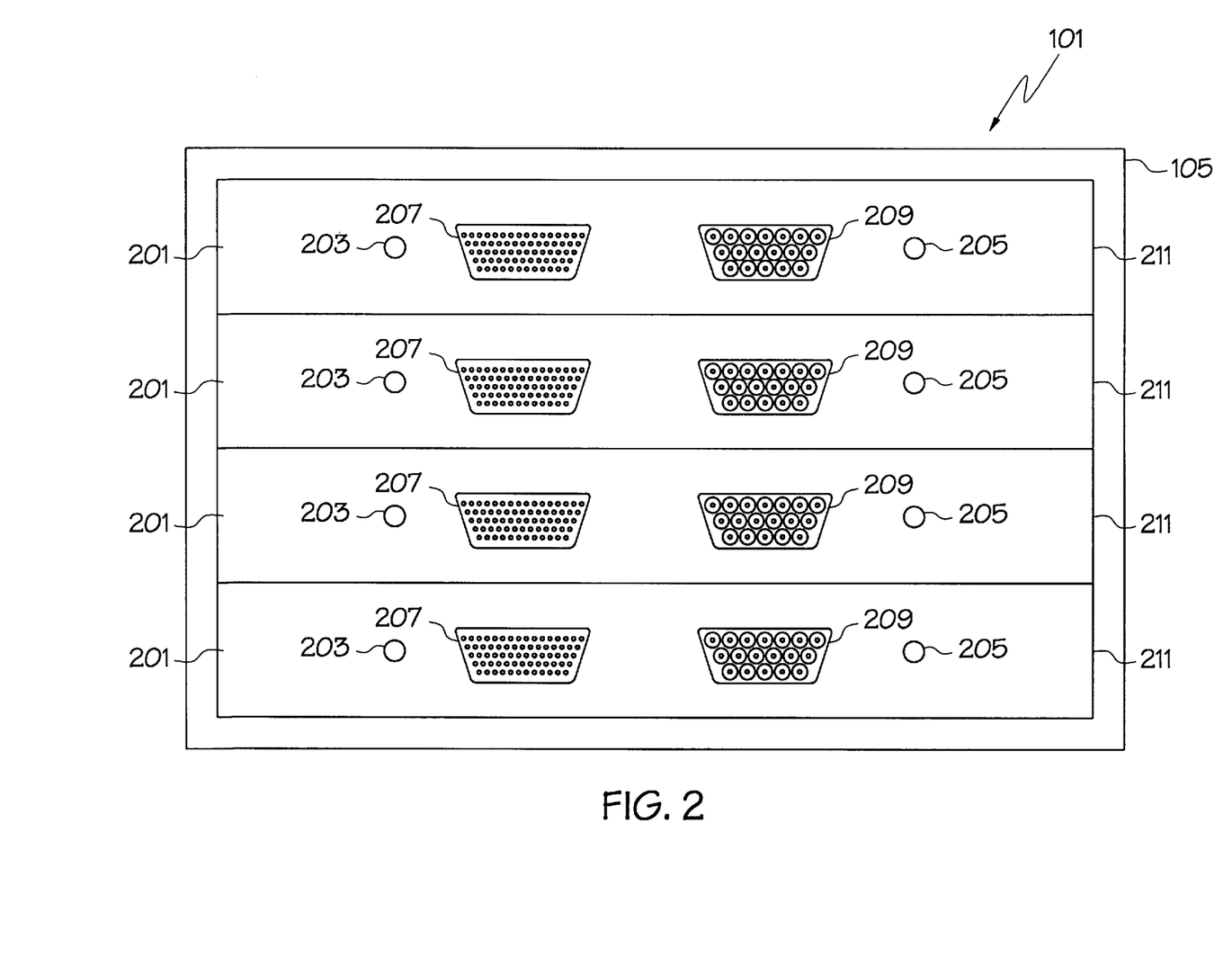
FIG. 2 shows an internal view of preferred internal power, data, and RF ports compatible with the present invention.

FIG. 2 shows an internal view of a preferred stacked network apparatus 101. The internal panel 201 of network device chassis 211 preferably contains a power source connector 203 and a power ground connector 205 which provides electrical power to the network device chassis 211. In a preferred embodiment relating to data-over-cable service, the power connector 203 connects to an electrical power line of 48 volts and approximately 100 watts, but it will be recognized by one of ordinary skill in the art that other power connectors and voltages may be used with the present invention without loss of generality. As described in more detail below, internal data connector 207 and internal RF connector 209 provide a connection between external network data, external RF, removable module 103 data and removable module 103 RF ports when the removable module 103 is present in the network device chassis 211.

Figure 3:
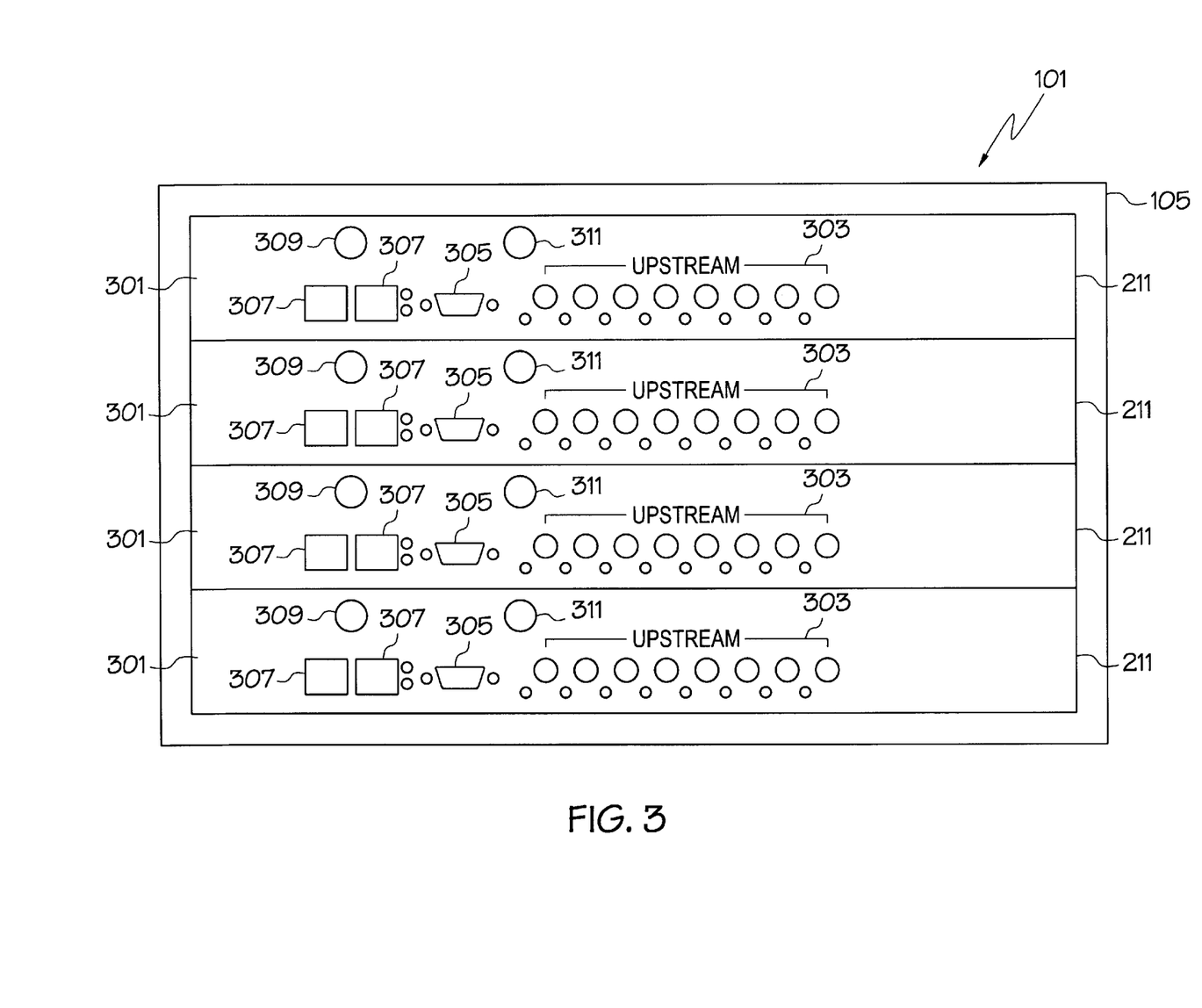
FIG. 3 shows a back view of preferred internal power, data, and RF ports compatible with the present invention.

FIG. 3 shows a back view of a preferred stacked network apparatus 101. The back panel 301 of network device chassis 211 preferably contains one or more external network data connectors 305, 307 and one or more external RF connector 303 to provide a connection with an external data network. Diagnostic information may optionally be displayed through electronic display means 309, 311. As described in more detail below, external network data connectors 305, 307 are electronically coupled to one or more internal data connectors 207, and one or more external RF connector 303 is electronically coupled to internal RF connector 209.

Figure 4:
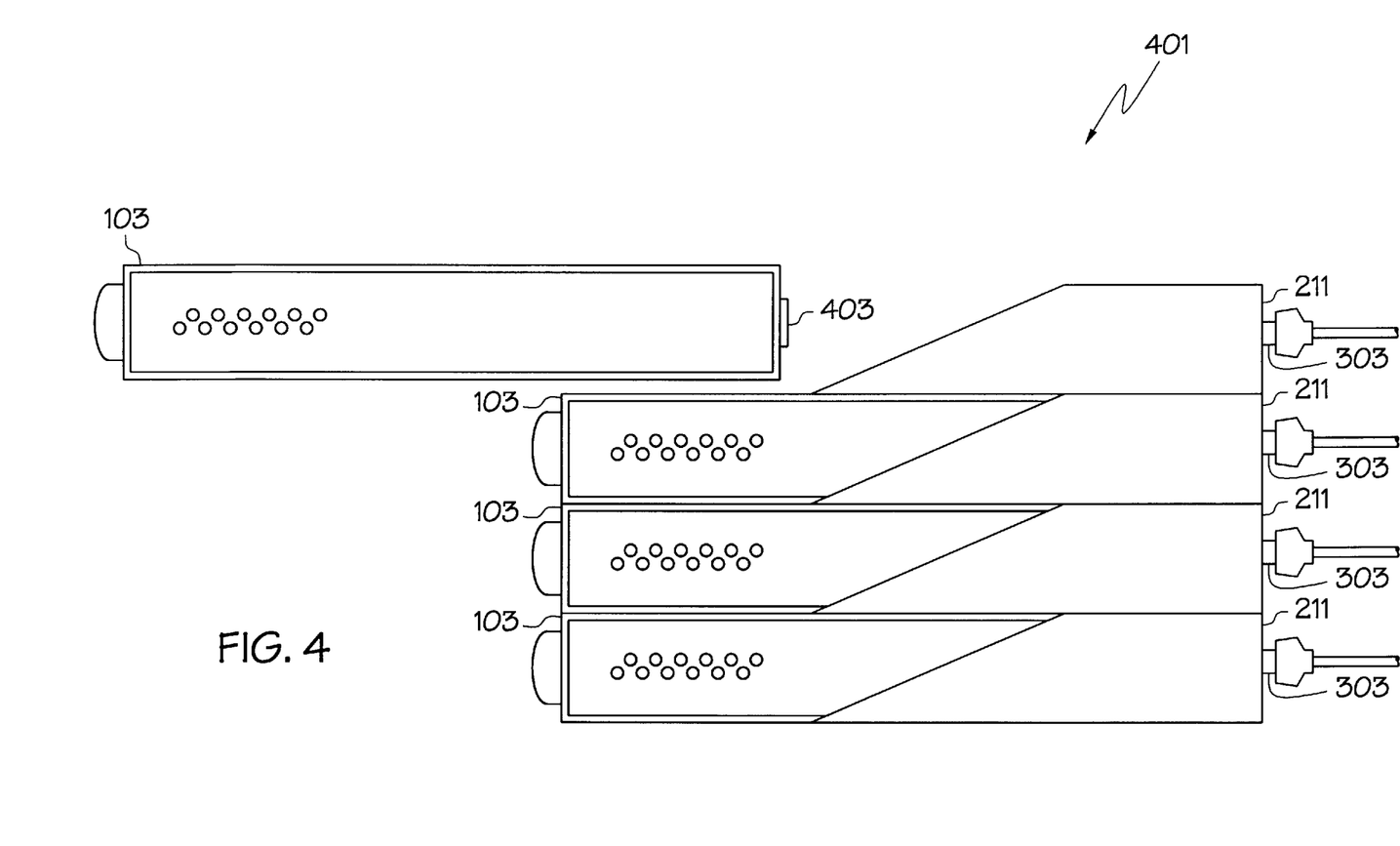
FIG. 4 shows a side view of a preferred removable network apparatus module compatible with the present invention.

FIG. 4 shows a side view of a preferred stacked removable network apparatus module 401. A removable module 103 may preferably be inserted into or removed from network device chassis 211, either connecting or disconnecting removable module 103 RF port 403 with internal RF connector 209 (not shown). External RF connector 303 is shown in profile being attached to the network device chassis 211.

Figure 5:
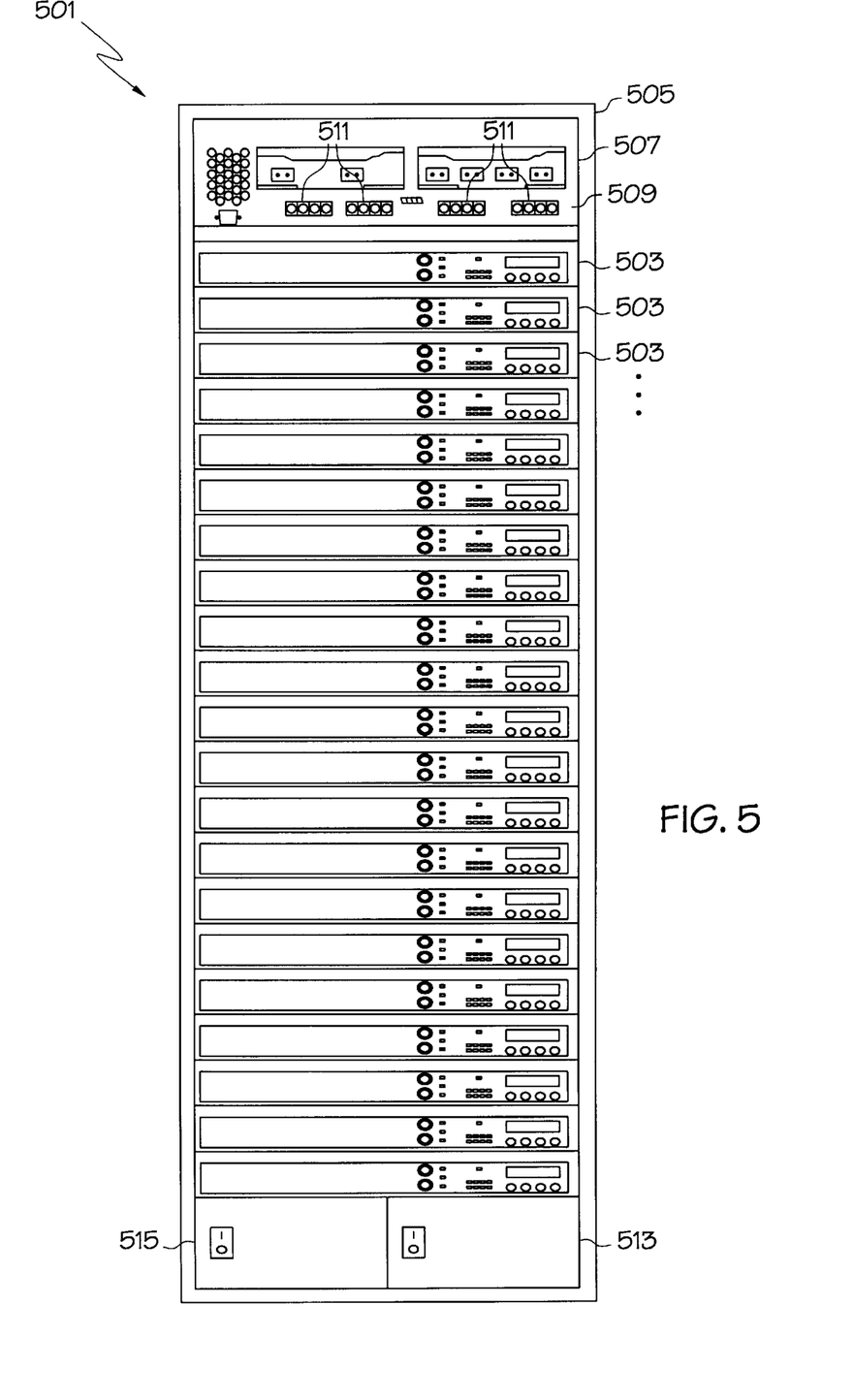
FIG. 5 shows a front view of preferred stacked network apparatus modules, in a rack compatible with the present invention.

FIG. 5 shows a front view of a preferred stacked network apparatus 501 in a rack 505. A removable module 503 may preferably be stacked in a vertical configuration via a rack 505. The front panel 509 of rack connection module 507 optionally contains connectors 511 for making additional connections to the system. Electric power is provided to all of the removable modules 503 in the rack by one or more power supplies 513, 515. The present invention does not provide any inherent limitation as to how many modules 503 may be stacked in a rack 505.

Figure 6:
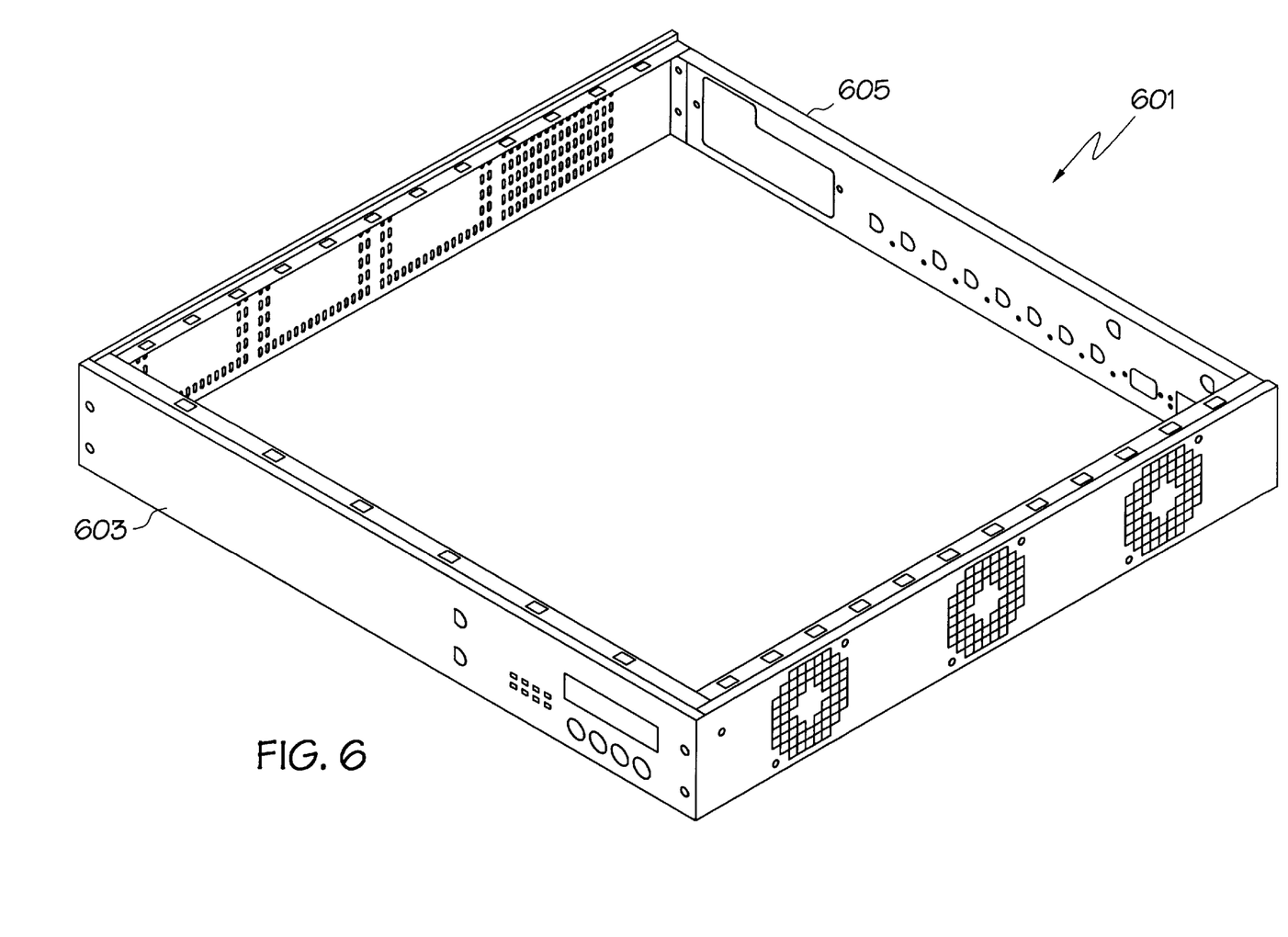
FIG. 6 shows a perspective view of a preferred network apparatus removable module compatible with the present invention.

FIG. 6 shows a perspective view of a preferred network apparatus removable module 601. A front panel 603 provides a distal edge, away from the point of electrical contact, where an electronic display may preferably be located. A back panel 605 provides a proximal edge, near the point of electrical contact, where module connectors may preferably be located. The advantage of this design is that external network cables may be kept out of sight on the back of the chassis, and diagnostic information may be displayed on the front of the removable module, which is desirable in many commercial applications.

Figure 7:
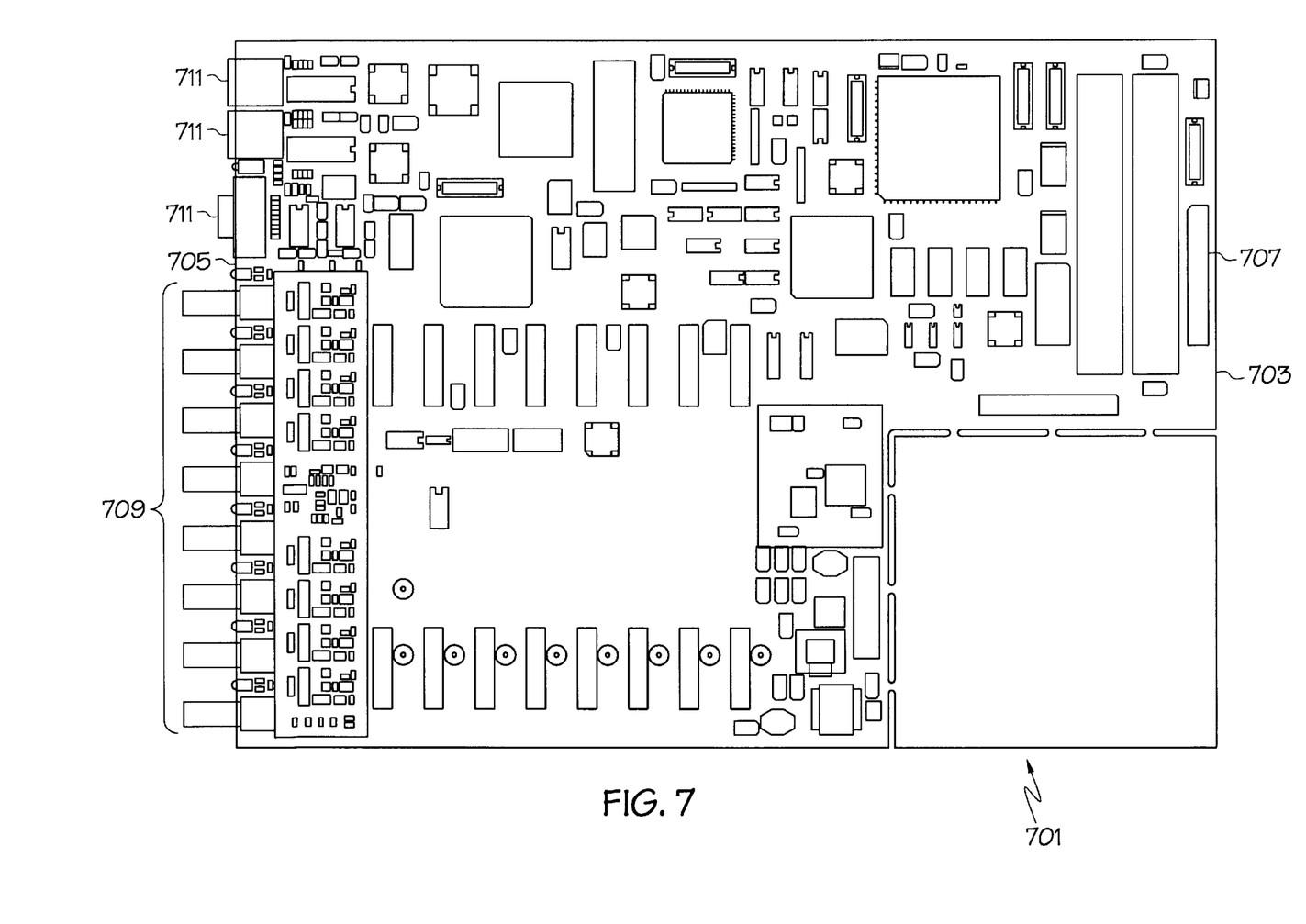
FIG. 7 shows an electrical schematic of a preferred network apparatus module compatible with the present invention.

FIG. 7 shows an electrical schematic of a preferred network apparatus module 701. The schematic shows a front edge 703 and electronic display 707, and back edge 705 with module RF connectors 709 and module data connectors 711, corresponding to the front panel 603 and back panel 605 shown in FIG. 6. It will be recognized by one of ordinary skill in the art that the electronic connections between external, internal, and module connectors 709, 711 may vary greatly between embodiments of the present invention without loss of generality.

Figure 8A:
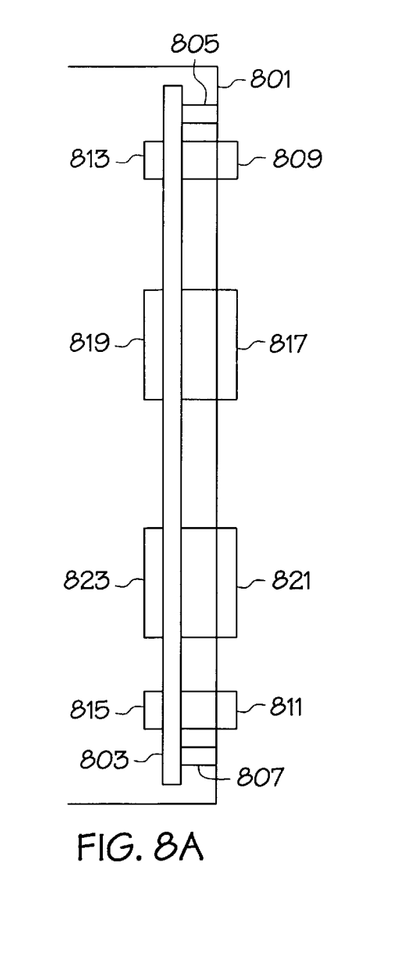
FIG. 8A–8C show top views of alternative embodiments of the interface between external and internal power, data, and RF ports compatible with the present invention.
Figure 8B:
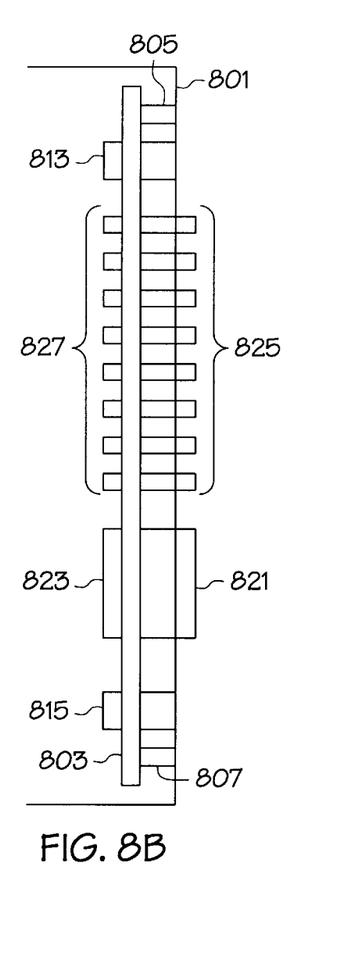
Figure 8C:
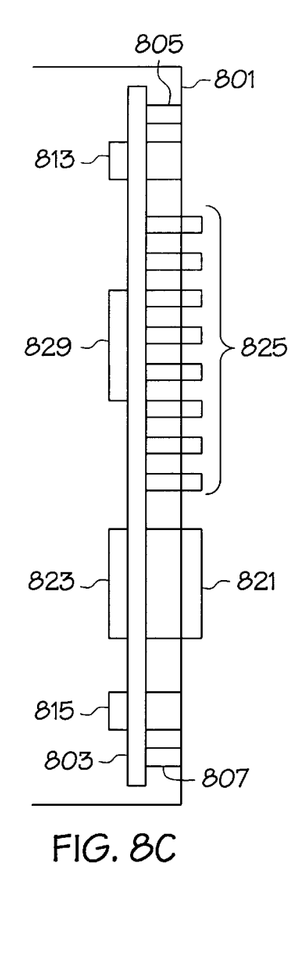

FIG. 8A–8C show top views of alternative embodiments of the interface between external and internal power, data, and RF ports which may be used with the present invention. A network device chassis 801 preferably contains a mounting platform 803. The mounting platform 803 may optionally be a printed circuit board or other platform capable of transmitting electronic signals. One or more mounting posts or brackets may be one of many ways to attach the mounting platform 803 to the chassis 801. As shown in FIG. 8A, internal power source connector 813 and internal power ground connector 815 may be coupled directly to external power source connector 809 and external power ground connector 811, either through a simple pass-through configuration or through power line conditioning or electronics located on the mounting platform 803. External network data connector 821 may be directly or indirectly electronically coupled to internal data connector 823. External network RF connector 817 may be directly or indirectly electronically coupled to internal RF connector 819, shown in FIG. 8A as "D" connector. FIG. 8B shows an alternative embodiment where the external network RF connectors 825 are coaxial cables coupled directly or indirectly to internal RF connectors 827. FIG. 8C shows where external network RF connectors 825 are coaxial cables coupled to internal RF connector 829, which is a "D" style connector. It will be recognized by one of ordinary skill in the art that many variations may be made as to the type and positioning of the internal and external data, RF, power, and other types of connectors without loss of generality.

Figure 9A:
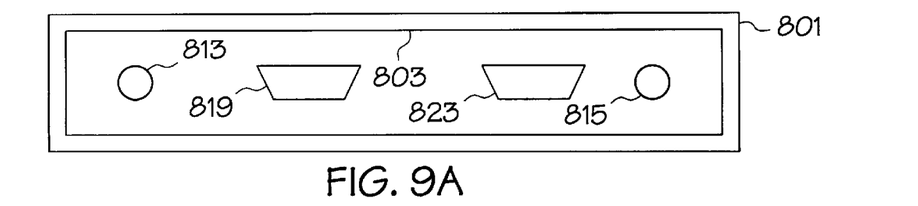
FIG. 9A–9C show internal views of alternative embodiments of internal power, data, and RF ports compatible with the present invention.
Figure 9B:
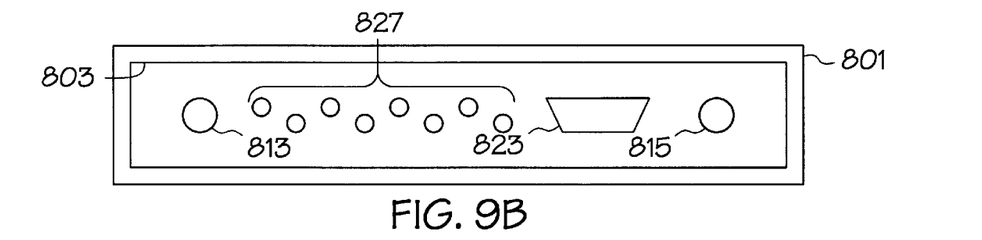
Figure 9C:
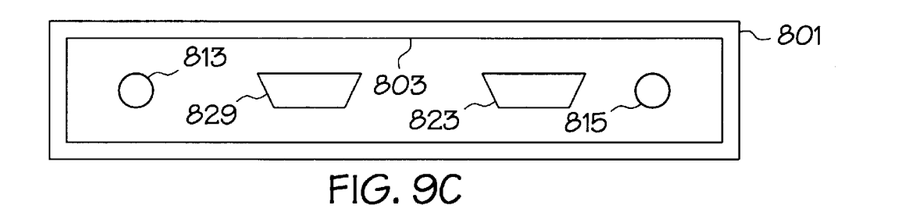

FIG. 9A–9C show internal views of alternative embodiments of internal power, data, and RF ports which may be used with the present invention. A network device chassis 801 preferably contains a mounting platform 803. Internal power source connector 813 and internal power ground connector 815 are used to provide power to the electronic module through electronic module power source and power ground connectors. Internal data connector 823 is used to provide a data connection to a module data connector. FIGS. 9A–9C variously show the internal RF connector either as a "D" style connector 819, 829, or as coaxial connectors 827.

Figure 10A:
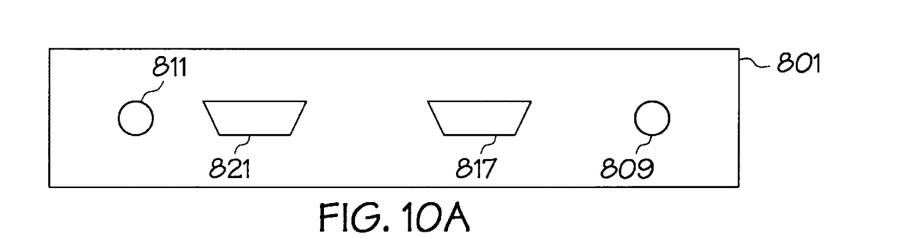
FIG. 10A–10C show back views of alternative embodiments of external power, data, and RF ports compatible with the present invention.
Figure 10B:
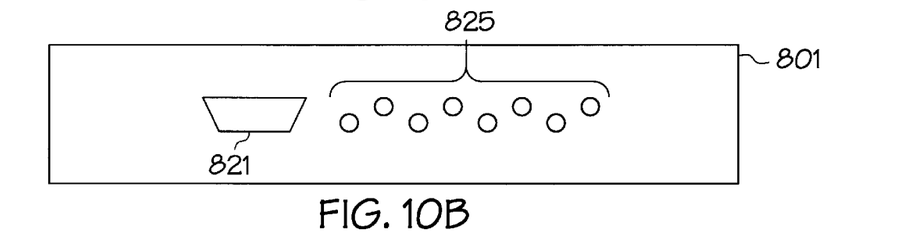
Figure 10C:
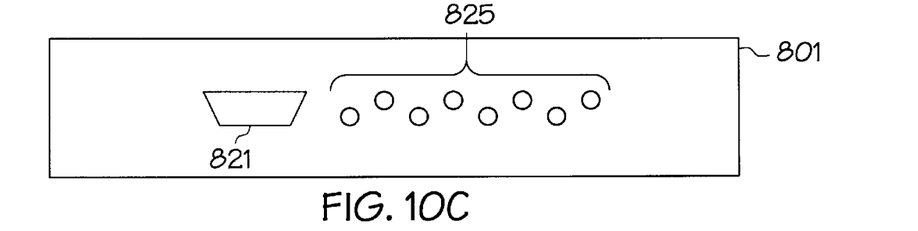

FIG. 10A–10C show back views of alternative embodiments of external power, data, and RF ports which may be used with the present invention. A network device chassis 801 preferably contains external power source connector 809 and external power ground connector 811, which are used to provide power to the electronic module through electronic module power source and power ground connectors. External data connector 821 is used to provide a data connection to a module data connector. FIGS. 10A–10C variously show the external RF connector either as a "D" style connector 817, or as coaxial connectors 825.

While the invention is described in terms of preferred embodiments in a specific system environment, those of ordinary skill in the art will recognize that the invention can be practiced, with modification, in other and different hardware and software environments within the spirit and scope of the appended claims.

What is claimed is:

1. A network apparatus comprising:
   a chassis having an external network data port at each of a plurality of positions;
   an internal network data port coupled to the external network data port; a plurality of external radio frequency (RF) connectors coupled to the chassis at each of the plurality of positions;
   a plurality of internal RF connectors, each of the plurality of internal RF connectors coupled to one of the plurality of external RF connectors; and
   a removable electronic module having a module network data port electronically coupled to the internal network data port and a plurality of module RF connectors electrically coupled to the plurality of internal RF connectors when the removable electronic module is present in the chassis at one of the plurality of positions.

2. The apparatus of claim 1 wherein the electronic module comprises a distal edge and a proximal edge, the module data port and the plurality of module RF connectors are located substantially along the proximal edge.

3. The apparatus of claim 2 further comprising:
   one or more power supply modules coupled to the chassis;
   a plurality of internal power connectors coupled to the one or more power supply modules; and
   a module power connector coupled to the electronic module, wherein the module power connector is electrically coupled to one of the plurality of internal power connectors when the removable electronic module is present in the chassis at one of the plurality of positions.

4. The apparatus of claim 3 wherein the module power connector is located substantially along the proximal edge of the electronic module.

5. The apparatus of claim 2 further comprising:
   an internal data bus connector coupled to the chassis; and
   a module data bus connector coupled to the electronic module, wherein the module data bus connector is electrically coupled to the internal data bus connector when the removable electronic module is present in the chassis, the module data bus connector located substantially along the proximal edge of the electronic module.

6. The apparatus of claim 2 further comprising an electronic display coupled to the electronic module substantially along the distal edge of the electronic module.

7. The apparatus of claim 1 wherein the electronic module may be inserted and removed from the chassis while electrical power is applied to the chassis.

8. A method for scaling a head end in a data-over-cable service network, the method comprising:
   connecting a plurality of head-end coaxial cables to a plurality of external radio frequency (RF) connectors at one of a plurality of positions on a chassis, each of the plurality of external RF connectors being coupled to one of a plurality of internal RF ports;
   connecting an external network connection to an external network data port at the one of the plurality of positions on the chassis, the external network data port being coupled to an internal network port; and
   inserting an electronic module at the one of the plurality of positions on the chassis, the electronic module having a plurality of module RF ports and a module network port, the insertion coupling the plurality of module RF ports to the plurality of internal RF ports and coupling the module network port to the internal network port, thereby incrementally increasing the scale of the data-over-cable service network provided by the head-end.

9. The method of claim 8, further comprising:
   removing the electronic module from the one of the plurality of positions on the chassis, the removal uncoupling the plurality of module RF ports from the plurality of internal RF ports and uncoupling the module network port from the internal network port, thereby incrementally decreasing the scale of the data-over-cable service network provided by the head-end.

10. The method of claim 8, further comprising:
    removing the electronic module from the one of the plurality of positions on the chassis; and inserting a second module at the one of the plurality of positions on the chassis, the second module having a second plurality of module RF ports and a second module network port, the insertion coupling the second plurality of module RF ports to the plurality of internal RF ports and coupling the second module network port to the internal network port, thereby maintaining the scale of the data-over-cable service network provided by the head-end.

* * * * *